United States Patent
Hara et al.

(10) Patent No.: US 9,817,293 B2
(45) Date of Patent: Nov. 14, 2017

(54) OPTICAL MODULATOR

(71) Applicant: Sumitomo Osaka Cement Co., Ltd, Tokyo (JP)

(72) Inventors: Tokutaka Hara, Tokyo (JP); Norikazu Miyazaki, Tokyo (JP)

(73) Assignee: SUMITOMO OSAKA CEMENT CO., LTD., Chiyoda-Ku, Tokyo (JP)

( * ) Notice: Subject to any disclaimer, the term of this patent is extended or adjusted under 35 U.S.C. 154(b) by 0 days.

(21) Appl. No.: 15/300,426

(22) PCT Filed: Mar. 27, 2015

(86) PCT No.: PCT/JP2015/059669
§ 371 (c)(1),
(2) Date: Sep. 29, 2016

(87) PCT Pub. No.: WO2015/152061
PCT Pub. Date: Oct. 8, 2015

(65) Prior Publication Data
US 2017/0123287 A1    May 4, 2017

(30) Foreign Application Priority Data
Mar. 31, 2014    (JP) ................. 2014-071019

(51) Int. Cl.
G02B 6/12    (2006.01)
G02F 1/225   (2006.01)
G02F 1/21    (2006.01)

(52) U.S. Cl.
CPC ...... *G02F 1/2255* (2013.01); *G02F 2001/212* (2013.01); *G02F 2201/58* (2013.01)

(58) Field of Classification Search
CPC ............................. G02B 6/12; G02B 6/12256
(Continued)

(56) References Cited

U.S. PATENT DOCUMENTS 5,347,601 A * 9/1994 Ade .................. G02B 6/12004
                                                385/14
6,670,599 B2 * 12/2003 Wagner ................. H01L 31/12
                                                250/214.1
(Continued)

FOREIGN PATENT DOCUMENTS

JP    2008180997 A    8/2008
JP       4977789 B1    7/2012
(Continued)

OTHER PUBLICATIONS

International Search Report of PCT/JP2015/059669 dated Jun. 16, 2015.

*Primary Examiner* — Kaveh C Kianni
(74) *Attorney, Agent, or Firm* — Taft Stettinius & Hollister LLP

(57) ABSTRACT

An object is to provide an optical modulator in which a light receiving element is disposed on a substrate configuring the optical modulator and which is capable of suppressing a decrease in the frequency bandwidth of the light receiving element even in a case in which two radiated lights from a combining part in a Mach-Zehnder type optical waveguide are received and monitored at the same time. The optical modulator includes a substrate 1, an optical waveguide including a Mach-Zehnder type optical waveguide formed in the substrate, and a modulation electrode (not illustrated) for modulating light waves that propagate through the optical waveguide, a light receiving element 5 is disposed to bridge over an output waveguide 24 configuring the Mach-Zehnder type optical waveguide so as to receive two radiated lights being radiated from a combining part in the Mach-Zehnder type optical waveguide, and, in the light receiving element, (Continued)

two or more light receiving areas (51 and 52) are formed apart from each other on a substrate of light receiving element 55.

12 Claims, 3 Drawing Sheets

(58) Field of Classification Search
USPC .............................................................. 385/3
See application file for complete search history.

(56) References Cited

U.S. PATENT DOCUMENTS

| | | | |
|---|---|---|---|
| 6,795,620 B2 | 9/2004 | Tavlykaev | |
| 7,067,072 B2* | 6/2006 | Chen | C09K 11/574 252/301.36 |
| 7,480,425 B2* | 1/2009 | Gunn | G02B 6/12007 385/14 |
| 8,977,086 B2* | 3/2015 | DeCorby | G01J 3/02 385/131 |
| 2004/0126050 A1* | 7/2004 | Claydon | G02B 6/4206 385/14 |
| 2011/0075963 A1* | 3/2011 | Choi | G01N 21/7746 385/12 |
| 2014/0140655 A1* | 5/2014 | Chakravarty | B82Y 20/00 385/12 |

FOREIGN PATENT DOCUMENTS

| | | |
|---|---|---|
| JP | 2013080009 A | 5/2013 |
| JP | 2015102789 A | 6/2015 |
| JP | 2015138145 A | 7/2015 |

\* cited by examiner

OPTICAL MODULATOR

TECHNICAL FIELD

The present invention relates to an optical modulator and particularly to an optical modulator which includes a Mach-Zehnder type optical waveguide and has a configuration in which radiated light being radiated from a combining part in the Mach-Zehnder type optical waveguide is detected using a light receiving element.

BACKGROUND ART

In optical communication fields or optical measurement fields, a variety of optical modulators such as intensity modulators including Mach-Zehnder type optical waveguides are being used. The intensity changes of light being output from Mach-Zehnder type optical waveguides show sinusoidal characteristics with respect to voltages being applied to modulation electrode. In order to obtain appropriate intensities of output light in accordance with the use of optical modulators, it becomes necessary to set modulation signal which is applied to modulation electrode to appropriate operating bias point.

Therefore, in the related art, some of signal light which is output from optical modulator or radiated light which is radiated from combining part in Mach-Zehnder type optical waveguides is detected as monitoring light using light receiving element such as photo detector, and the intensity state of output light from optical modulator is monitored. In addition, the operating bias point of modulation signal which is applied to modulation electrode is adjusted (bias-controlled) on the basis of detection values (monitor output) of light receiving element.

Patent Literature No. 1 discloses an optical modulator in which radiated light is monitored using a light receiving element 5 disposed outside a substrate 1. Specifically, in the substrate 1 having an electro-optic effect, an optical waveguide 2 including a Mach-Zehnder type optical waveguide (21 to 24) is formed. Modulation electrode for modulating light waves that propagate through the optical waveguides is provided along two branching waveguides which configure the Mach-Zehnder type optical waveguide, which are not illustrated in the drawing. The output waveguide 24 has an optical fiber 4 connected thereto and is constituted to output outgoing light to the outside.

Two radiated lights (R1 and R2) being radiated from a combining part 23 in the Mach-Zehnder type optical waveguide pass through the inside of a capillary 3 for reinforcement to connect the optical fiber 4 to an end portion of the substrate 1 and are introduced into the light receiving element 5. Particularly, as illustrated in FIG. 1, By configuring for two radiated lights to be detected by a single light receiving element, it is possible to monitor two radiated lights in a combined state, and to compensate for phase difference between monitoring light and output light S.

In order to improve the accuracy of compensating phase difference between monitoring light and output light, it is essential to optimally set light intensity ratio at which two radiated lights are received. Therefore, any light intensity ratio-adjusting means is provided between the capillary 3 and the light receiving element 5 in FIG. 1.

Patent Literature No. 2 discloses a configuration in which the light receiving element 5 is disposed on the substrate 1 on which an optical modulator is configured as illustrated in FIG. 2 and FIG. 3. Specifically, in the substrate 1, the optical waveguide 2 including a Mach-Zehnder type optical waveguide and a modulation electrode (not illustrated) for modulating light waves that propagate through the optical waveguide are formed. The light receiving element 5 is disposed to bridge over the output waveguide 24 which configures the Mach-Zehnder type optical waveguide.

In FIG. 2, the light receiving element 5 is configured to receive two radiated lights being radiated from the combining part in the Mach-Zehnder type optical waveguide together. The radiated lights propagate through the inside of the substrate 1; however, in order to precisely control locations through which radiated light propagates, it is possible to provide waveguides for radiated light (25 and 26) which guide radiated light. The light receiving element 5 is disposed so as to span the two waveguides for radiated light (25 and 26).

FIG. 3 is a sectional view in a direction of a dash-dot line X-X' in FIG. 2. High-refractive-index films (40 and 41) are disposed in contact with or close to the waveguides for radiated light (25 and 26), whereby some (R1 and R2) of radiated lights are absorbed toward the light receiving element 5 and are incident on an optical detecting area 50.

In the configuration of FIG. 2 and FIG. 3, two radiated lights can be received at the same time, and, as described in an example of the related art of FIG. 1, phase difference between monitoring light for which radiated light is used and output light which comes from the output waveguide is compensated by adjusting the light-receiving intensities of the two radiated lights and by receiving two radiated lights simultaneously so that it becomes possible to obtain favorable monitoring characteristics.

As disclosed in Patent Literature No. 1, in a case in which the light receiving element 5 is disposed outside the substrate 1, in a case in which plural of Mach-Zehnder type optical waveguides are integrated on the same substrate or a case in which a Mach-Zehnder type optical waveguide is formed at a location away from an end surface of a substrate and another optical waveguide is present between the Mach-Zehnder type optical waveguide and a capillary, it becomes extremely difficult to guide only intended light waves to the light receiving element.

In contrast, as disclosed in Patent Literature No. 2, the configuration in which the light receiving element is disposed on the surface of the substrate 1 has an advantage that it is possible to precisely receive intended light waves. However, in order to receive two radiated lights at the same time, it becomes necessary to form a light-receiving area having a size that is approximately identical to or larger than the gap W between the two waveguides for radiated light (25 and 26) illustrated in FIG. 3. An increase in the area of optical detecting area causes a problem of frequency bandwidth of light receiving elements being decreased in inverse proportion to the size thereof.

CITATION LIST

Patent Literature

[Patent Literature No. 1] Japanese Patent No. 4977789
[Patent Literature No. 2] Japanese Laid-open Patent Publication No. 2013-80009
[Patent Literature No. 3] Japanese Laid-open Patent Publication No. 2014-009554 (filed on Jan. 22, 2014)

SUMMARY OF INVENTION

Technical Problem

An object of the present invention is to solve the above-described problems and to provide an optical modulator which is capable of suppressing a decrease of the frequency bandwidth of the light receiving element even in a case in which a light receiving element is disposed on a substrate configuring the optical modulator and two radiated lights from a combining part in a Mach-Zehnder type optical waveguide are received and monitored at the same time.

Solution to Problem

In order to achieve the above-described object, an optical modulator of the present invention has technical characteristics described below.

(1) An optical modulator including: a substrate; an optical waveguide including a Mach-Zehnder type optical waveguide formed in the substrate; and a modulation electrode for modulating light waves that propagate through the optical waveguide, in which a light receiving element is disposed to bridge over an output waveguide constituting the Mach-Zehnder type optical waveguide so as to receive two radiated lights being radiated from a combining part in the Mach-Zehnder type optical waveguide, and, in the light receiving element, two or more optical detecting areas are formed apart from each other on a substrate of light receiving element.

(2) The optical modulator according to the above-described (1), in which a low-refractive-index structure is formed between the output waveguide and the light receiving element, and high-refractive-index structures are formed between a portion in the substrate through which the radiated light propagates and the light receiving element.

(3) The optical modulator according to the above-described (2), in which a gap between two of the high-refractive-index structures sandwiching the low-refractive-index structure is two times larger than a mode field diameter of a light wave propagating through the output waveguide.

(4) The optical modulator according to the above-described (1), in which grooves or reflection members are disposed in a location in the substrate through which the radiated light propagates, and the radiated light is guided to the light receiving element.

(5) The optical modulator according to the above-described (4), in which a gap between two of the grooves or two of the reflection members which sandwich the output waveguide is two times larger than a mode field diameter of a light wave propagating through the output waveguide.

(6) The optical modulator according to any one of the above-described (1) to (5), in which a waveguide for radiated light which guides the radiated light is formed in the substrate.

(7) The optical modulator according to any one of the above-described (1) to (6), in which a thickness of the substrate is 20 µm or less.

Advantageous Effects of Invention

Since the optical modulator of the present invention is an optical modulator including a substrate, an optical waveguide including a Mach-Zehnder type optical waveguide formed in the substrate, and a modulation electrode for modulating light waves that propagate through the optical waveguide, in which a light receiving element is disposed to bridge over an output waveguide constituting the Mach-Zehnder type optical waveguide so as to receive two radiated lights being radiated from a combining part in the Mach-Zehnder type optical waveguide, and, in the light receiving element, two or more optical detecting areas are formed apart from each other on a substrate of the light receiving element, it is possible to set the area of one optical detecting area to be smaller than that in the related art, and it is possible to provide an optical modulator capable of suppressing a decrease in the frequency bandwidth of the light receiving element.

DESCRIPTION OF EMBODIMENTS

Hereinafter, an optical modulator of the present invention will be described in detail.

Figure 3:
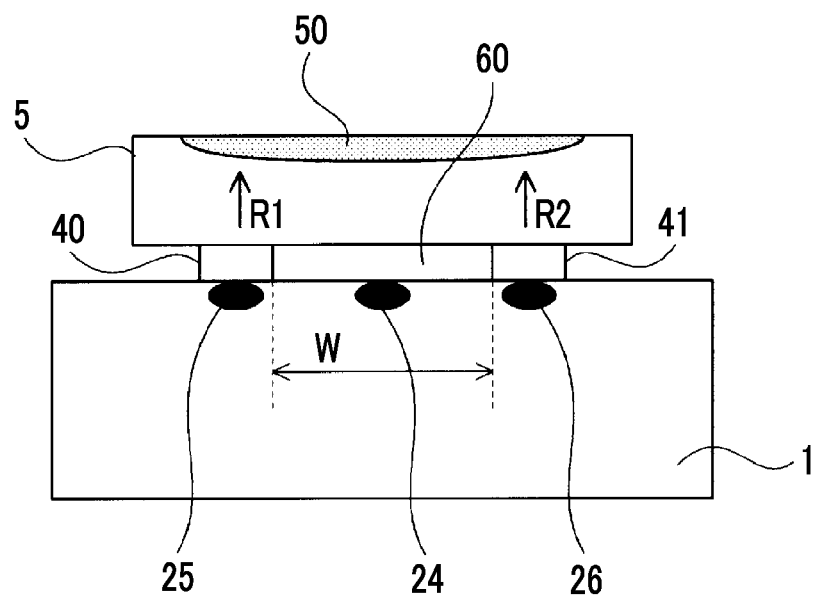
FIG. 3 is a view illustrating a sectional view in a direction of a dash-dot line X-X' illustrated in FIG. 2.
Figure 4:
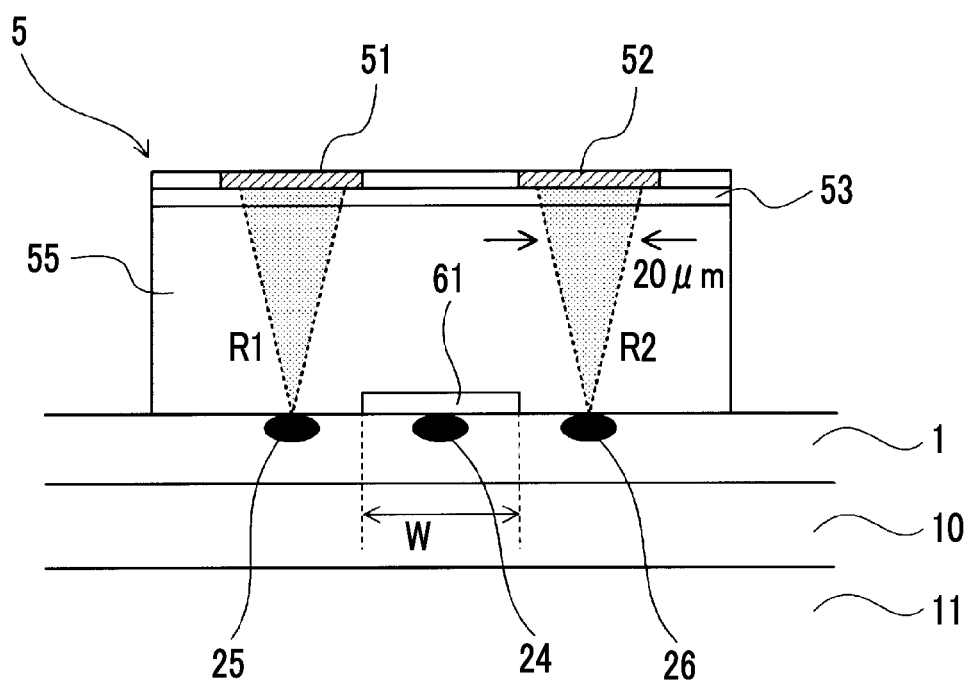
FIG. 4 is a view illustrating an outline of the light receiving element that is used in the optical modulator of the present invention.

The optical modulator of the present invention is an optical modulator including, as illustrated in FIG. 4, a substrate 1, an optical waveguide including a Mach-Zehnder type optical waveguide formed in the substrate; and a modulation electrode (not illustrated) for modulating light waves that propagate through the optical waveguide, in which a light receiving element 5 is disposed to bridge over an output waveguide 24 configuring the Mach-Zehnder type optical waveguide so as to receive two radiated lights being radiated from a combining part in the Mach-Zehnder type optical waveguide, and, in the light receiving element, two or more optical detecting areas (51 and 52) are formed apart from each other on a substrate of the light receiving element 55. Meanwhile, FIG. 4, similar to FIG. 3, mainly illustrates the outline of a sectional view of the light receiving element disposed to bridge over the output waveguide.

The substrate 1 may be any substrate made of silica, a semiconductor, or the like as long as the substrate is capable of forming optical waveguide, and particularly, any of single crystals such as $LiNbO_3$, $LiTaO_3$, or lead lanthanum zirconate titanate (PLZT) which are substrates having an electro-optic effect can be preferably used.

Particularly, in substrate preferable for the present invention, the thickness of the substrate is 20 µm or less. In the thinned substrate as described above, it is easier to guide light waves inside the substrate so that it is difficult to separate light waves that propagate through optical waveguides and light waves that propagate through the inside of the substrates. Therefore, when light receiving element is disposed on the substrate as in the optical modulator of the present invention, it becomes possible to efficiently receive intended light waves. Furthermore, the amount of unnecessary light that propagates through the inside of the substrate also increases, and thus, by receiving two radiated lights at the same time as disclosed in Patent Literature No. 1 or Patent Literature No. 2, it becomes possible to obtain more precise monitoring signals. In order to use substrates having a thickness of 20 μm or less, a configuration in which the substrate 1 is mechanically reinforced as illustrated in FIG. 4 is required, and a reinforcing substrate 11 is joined to the substrate 1 through a bonding layer 10 such as a resin or the like.

Optical waveguide formed in a substrates is formed by, for example, thermally diffusing high-refractive-index substance such as titanium (Ti) in $LiNbO_3$ substrates (LN substrate). In addition, rib type optical waveguide in which groove is formed on both sides of the portion in which optical waveguide is formed or ridge type waveguide with convex like shape can be also used. In addition, the present invention can also be applied to optical circuits obtained by forming optical waveguide in different substrate such as Planar Lightwave Circuits and integrating the substrate by means of attaching.

The modulation electrode is consisted of a signal electrode and a ground electrode and can be formed by forming an electrode pattern of Ti and Au on a substrate surface and carrying out gold plating or the like. Furthermore, if necessary, it is also possible to provide a buffer layer such as dielectric $SiO_2$ on the substrate surface after the formation of optical waveguide. Meanwhile, when the buffer layer is formed in a region in which radiated lights that propagate through the inside of the substrate (the optical waveguide) is led toward the light receiving element side, it becomes difficult to efficiently lead the radiated lights, and thus it is preferable to form no buffer layer in the region.

A characteristic of the optical modulator of the present invention is that, as illustrated in FIG. 4, in the light receiving element being used in the optical modulator, two or more optical detecting areas (51 and 52) are formed apart from each other on one substrate of the light receiving element 55. Therefore, it is possible to decrease the area of one optical detecting area and suppress a decrease in the frequency bandwidth of the light receiving element.

By connecting wires in the respective optical detecting areas are connected to each other in parallel although each of the optical detecting areas is received radiated lights individually, monitoring signals from the optical detecting areas are electrically superimposed so that it is possible to obtain almost the same effect as the case in which two radiated lights are substantially received in a single optical detecting area at the same time. As a result, it is possible to monitor two radiated lights at the same time without decreasing frequency bandwidths so that it becomes possible to more accurately compensate phase difference between monitoring light and output light that propagates through the output waveguide 24.

As the light receiving element 5, a photo-diode (PD) can be preferably used. In FIG. 4, a light-receiving layer 53 made of InGaAs (in a case in which the wavelength of light waves being received is 1,550 nm) or GaAs (850 nm) is provided on the InP or GaAs substrate (substrate of light receiving element) 55, and two optical detecting areas (51 and 52) are independently disposed so as to come into contact with the light-receiving layer 53. On the respective optical detecting areas (51 and 52), two radiated light (R1 and R2) are respectively incident as monitoring light.

In FIG. 4, by contacting the substrate of light receiving element 55 having a higher refractive index than the refractive indexes of waveguides for radiated light with the waveguides for radiated light (25 and 26) that guide two radiated lights, radiated light that propagates through the waveguides for radiated light is absorbed toward the optical detecting areas (51 and 52). Between the output waveguide 24 and the substrate 55, a cavity 61 such as an air gap is formed.

The position of the optical detecting area may be located above the waveguides for radiated light (waveguides for monitoring) in a case of viewing from a sectional direction of the waveguide as illustrated in FIG. 4. This is because light (evanescent wave) radiated from the waveguides for radiated light to inside of the substrate of light receiving element is radiated in a normal direction to a waveguide substrate in the section of the waveguide and the radiating angles are symmetric with respect to the normal line.

Figure 5:
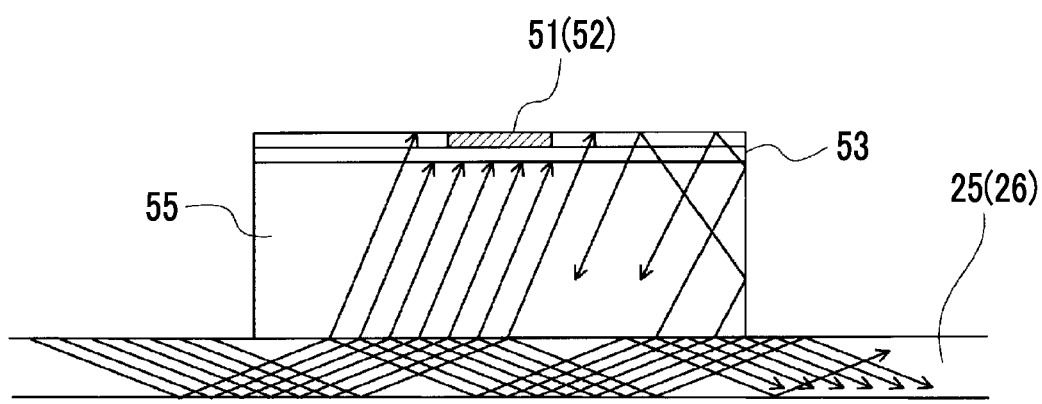
FIG. 5 is a sectional view of the light receiving element of FIG. 4 in a direction of a waveguide for radiated light and is a view illustrating an aspect of propagation of light waves.

In addition, in the progressing direction of guided light, the optimal locations of the optical detecting areas are determined depending on the radiating angle of monitoring light. For example, when the refractive index of the substrate of light receiving element is set to 3.16, and the effective refractive index of the waveguide is set to 2.15, the radiating angle becomes a direction forming approximately 43 degrees with respect to the normal line to the waveguide substrate. However, in a case in which the multi-reflection of monitoring light in the substrate of light receiving element is taken into account, the progressing direction is not limited thereto. FIG. 5 is a sectional view of the light receiving element in a direction of the waveguides for radiated light (25 and 26) which are waveguides for monitoring and illustrates an aspect of some of light waves (arrows) that propagate through the waveguides for monitoring being entered into inside of the substrate of light receiving element.

The area of the optical detecting areas can be arbitrarily set; however, in a sectional direction of the waveguide, it is preferable to set the area to approximately the beam width of monitoring light in the light receiving areas. For example, when the wavelength of guided light is set to 1.55 μm, the mode field diameter of the waveguide is set to 10 μm, and the height of the substrate of light receiving element is set to 150 μm, the widths of beams at the light receiving areas reach approximately 20 μm on the condition of the above-described refractive indices. However, when the mounting location tolerance of the light receiving element is taken into account, the widths of the light receiving areas may be set to approximately 40 to 80 μm.

Meanwhile, as illustrated in FIG. 5, in the extending direction of the waveguide, monitoring light becomes a parallel beam having an almost constant intensity, and thus the widths of the light receiving areas are not particularly limited, but the light receiving areas may have a square or circular shape from the productivity of PD point of view.

When the two light receiving areas are electrically connected to each other in parallel by means of wire bonding or the like, two monitoring signals are superimposed with each other, and it becomes possible to eliminate phase difference against output light (main light). The optical detecting light receiving areas can also be electrically connected to each other in parallel not only by wire bonding but also by forming wires on the photo-diode substrate by means of patterning.

Meanwhile, the number of the light receiving area is not limited to two, and it is also possible to configure a light receiving area that receives one radiated light by dividing the optical detecting light receiving area into two or more light receiving areas. Generally, when the area of the light receiving area increases, frequency bandwidth decreases, and thus the light receiving area may be divided into multiple areas in consideration of the corresponding bandwidth. However, dividing the light receiving area into a number of areas makes wire bonding or wire patterns complex and thus causes an increase in manufacturing cost. Therefore, with respect to one radiated light, the number of the optical detecting areas may be suppressed to 1 to 5.

On the other hand, when the light-receiving area decreases, sensitivity decreases. Therefore, it is also significantly effective to combine the technique of using multi-reflection in light receiving element which is disclosed in the patent application (refer to Patent Literature No. 3) which has been previously filed by the present applicants to an aspect of the present invention. However, when the disposition location of the light receiving element is finely adjusted with respect to the waveguides for radiated light, it is possible to adjust the balance between the amounts of light receiving of two radiated lights. In order to utilize this adjustment, it becomes necessary to control reflection so as to prevent, for example, one radiated light from being incident on the light receiving area on which only the other radiated light should be incident more than necessary due to multiple-reflected light waves.

In order to realize the multi-reflection of radiated light in the substrate configuring the light receiving element 5, a reflection film such as a multilayer dielectric film or a metal reflection film may be disposed in a place in which light waves are reflected or it may be also possible to use total reflection in the substrate. For example, it is possible to increase reflection efficiency by reflecting radiated light on the bottom surface of a metal film configuring an implanted electrode or by disposing a multilayer dielectric film or a metal film in at least a part of the outer circumference surface of the substrate. Furthermore, when a multilayer dielectric film or a metal film is used, stable reflection becomes possible regardless of the surface state (contamination and the like) of the substrate of light receiving element.

In order to introduce light waves which are supposed to be monitored into the light receiving element, there are the methods which are not only the substrate of light receiving element 55 is directly contacted with places in which light waves are guided such as the optical waveguides as disclosed in Patent Literature No. 2 as well but also high-refractive-index films (40 and 41) are interposed between the optical waveguide 25 (26) or the like and the substrate of light receiving element 55 as illustrated in FIG. 3. In this case, it is necessary to set the refractive index of the high-refractive-index film to be higher than the refractive index of the optical waveguide 25 (26) (or the substrate 1 in which light waves are guided) and lower than the refractive index of the substrate of light receiving element 55. As described above, a high-refractive-index structure (a structure having a higher refractive index than that of a portion through which light waves propagate) is provided between a portion through which light waves which are supposed to be monitored propagate and the light receiving element, and additionally, a low-refractive-index structure (a structure having a lower refractive index than that of a portion through which light waves propagate) is provided between a portion through which light waves which are supposed not to be monitored (light waves which need to be suppressed from being incident on the light receiving element) propagate and the light receiving element. The low-refractive-index structure may be configured not only by disposing a low-refractive-index film but also by interposing an air gap.

In addition, as disclosed in Patent Literature No. 2 as well, it is also possible to guide some of monitoring light to the light receiving element by disposing grooves or reflection members in the substrate 1 (or the optical waveguide 25 or the like).

In a case in which two high-refractive-index structures (40 and 41) sandwiching low-refractive-index structure 60 (61) are disposed as illustrated in FIG. 3 or FIG. 4, the gap W between the high-refractive-index structures may be set to two times larger than the mode field diameter of a light wave propagating through the output waveguide 24. This is to suppress the absorption of even light waves that propagate through the output waveguide toward the light receiving element. In addition, even in a case in which light waves which are supposed to be monitored are deflected toward the light receiving element side by disposing grooves or reflection members in the substrate 1, similarly, the width W between two grooves or two reflection members sandwiching the output waveguide 24 may be set to two times larger than the mode field diameter of a light wave propagating through the output waveguide.

Figure 1:
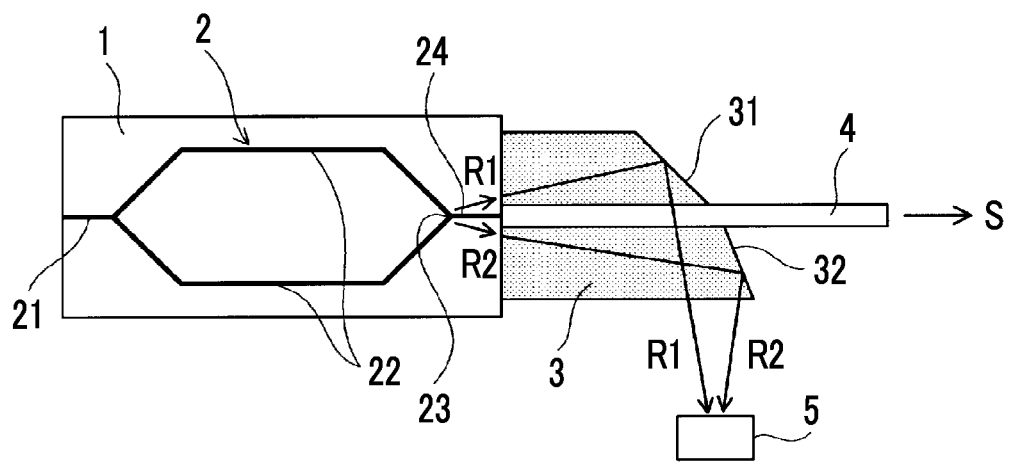
FIG. 1 is an example of the related art disclosed in Patent Literature No. 1 and is a view illustrating a shape in which a light receiving element is disposed outside a substrate constituting an optical modulator.
Figure 2:
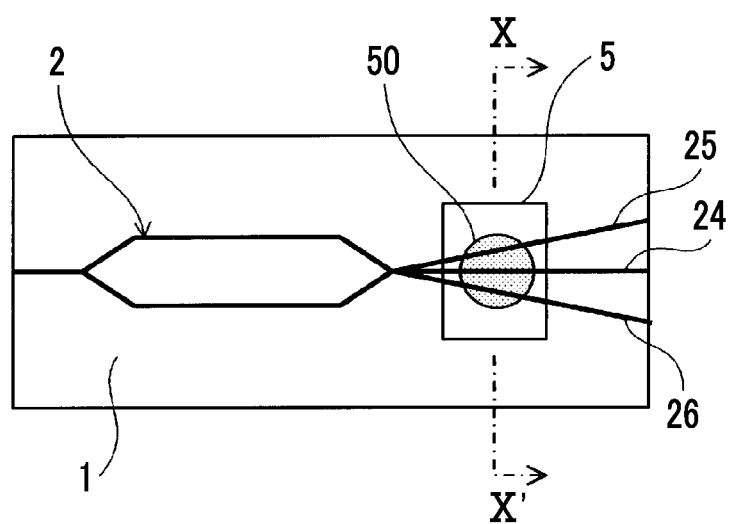
FIG. 2 is an example of the related art disclosed in Patent Literature No. 2 and is a view illustrating a shape in which a light receiving element is disposed on a substrate constituting an optical modulator.

Furthermore, even in the optical modulator of an aspect of the present invention, similar to Patent Literature No. 2, it becomes possible to adjust the ratio between the light-receiving amounts of two radiated lights by adjusting the disposition location of the light receiving element 5 with respect to the substrate 1 (or the optical waveguides 25 and 26). In addition, it becomes possible to more efficiently guide radiated light to the light receiving element 5 by providing the waveguides for radiated light (25 and 26) which guide radiated light as illustrated in FIG. 2.

INDUSTRIAL APPLICABILITY

As described above, according to the optical modulator of the present invention, it becomes possible to provide an optical modulator in which a light receiving element is disposed on a substrate configuring the optical modulator and which is capable of suppressing a decrease in the frequency bandwidth of the light receiving element even in a case in which two radiated lights from a combining part in a Mach-Zehnder type optical waveguide are received and monitored at the same time.

REFERENCE SIGNS LIST

1 SUBSTRATE
2 OPTICAL WAVEGUIDE
21 INPUT WAVEGUIDE
22 BRANCHED WAVEGUIDE
23 COMBINING PART
24 OUTPUT WAVEGUIDE
25, 26 WAVEGUIDE FOR RADIATED LIGHT
3 CAPILLARY
5 LIGHT RECEIVING ELEMENT
50, 51, 52 OPTICAL DETECTING AREA
55 PHOTO-DIODE SUBSTRATE OF LIGHT RECEIVING ELEMENT
40, 41 HIGH-REFRACTIVE-INDEX STRUCTURE
60, 61 LOW-REFRACTIVE-INDEX STRUCTURE

The invention claimed is:
1. An optical modulator comprising:
a substrate;
an optical waveguide including a Mach-Zehnder type optical waveguide formed in the substrate; and
a modulation electrode for modulating light waves that propagate through the optical waveguide,
wherein a light receiving element is disposed to bridge over an output waveguide constituting the Mach-

Zehnder type optical waveguide so as to receive two radiated lights being radiated from a combining part in the Mach-Zehnder type optical waveguide, and, in the light receiving element, two or more optical detecting areas are formed apart from each other on a substrate of light receiving element.

2. The optical modulator according to claim 1, wherein a low-refractive-index structure is formed between the output waveguide and the light receiving element, and high-refractive-index structures are formed between a portion in the substrate through which the radiated light propagates and the light receiving element.

3. The optical modulator according to claim 2, wherein a gap between two of the high-refractive-index structures sandwiching the low-refractive-index structure is two times larger than a mode field diameter of a light wave propagating through the output waveguide.

4. The optical modulator according to claim 1, wherein grooves or reflection members are disposed in a location in the substrate through which the radiated light propagates, and the radiated light is guided to the light receiving element.

5. The optical modulator according to claim 4, wherein a gap between two of the grooves or two of the reflection members which sandwich the output waveguide is two times larger than a mode field diameter of a light wave propagating through the output waveguide.

6. The optical modulator according to claim 1, wherein a waveguide for radiated light which guides the radiated light is formed in the substrate.

7. The optical modulator according to claim 1, wherein a thickness of the substrate is 20 μm or less.

8. The optical modulator according to claim 2, wherein a waveguide for radiated light which guides the radiated light is formed in the substrate.

9. The optical modulator according to claim 4, wherein a waveguide for radiated light which guides the radiated light is formed in the substrate.

10. The optical modulator according to claim 2, wherein a thickness of the substrate is 20 μm or less.

11. The optical modulator according to claim 4, wherein a thickness of the substrate is 20 μm or less.

12. The optical modulator according to claim 6, wherein a thickness of the substrate is 20 μm or less.

* * * * *